(12) United States Patent
Cao et al.

(10) Patent No.: US 12,204,209 B2
(45) Date of Patent: Jan. 21, 2025

(54) DISPLAY PANEL AND PREPARATION METHOD THEREOF, AND DISPLAY DEVICE

(71) Applicants: Beijing BOE Display Technology Co., Ltd., Beijing (CN); BOE Technology Group Co., Ltd., Beijing (CN)

(72) Inventors: Wei Cao, Beijing (CN); Xiaona Liu, Beijing (CN); Yu Ma, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 498 days.

(21) Appl. No.: 17/622,694

(22) PCT Filed: Feb. 25, 2021

(86) PCT No.: PCT/CN2021/077969
§ 371 (c)(1),
(2) Date: Dec. 23, 2021

(87) PCT Pub. No.: WO2022/178783
PCT Pub. Date: Sep. 1, 2022

(65) Prior Publication Data
US 2023/0152633 A1    May 18, 2023

(51) Int. Cl.
*G02F 1/1339* (2006.01)
*G02F 1/1333* (2006.01)
(Continued)

(52) U.S. Cl.
CPC ...... *G02F 1/1339* (2013.01); *G02F 1/133354* (2021.01); *G02F 1/1337* (2013.01);
(Continued)

(58) Field of Classification Search
None
See application file for complete search history.

(56) References Cited

U.S. PATENT DOCUMENTS 8,031,320 B2 * 10/2011 Lee .................. G02F 1/1339
349/154
2016/0259189 A1    9/2016 Kuramoto

FOREIGN PATENT DOCUMENTS

CN      101290417 A     10/2008
CN      105068326 A     11/2015
(Continued)

OTHER PUBLICATIONS

Written Opinion of the International Searching Authority issued in International Application No. PCT/CN2021/077969 dated Dec. 1, 2021, (2p).

*Primary Examiner* — Thanh Nhan P Nguyen
(74) *Attorney, Agent, or Firm* — Arch & Lake LLP

(57) ABSTRACT

The present disclosure relates to the field of display technologies, and discloses a display panel, a preparation method thereof, and a display device; the display panel has a display area and a non-display area adjacent to the display area, and the display panel includes an array substrate, an opposite substrate, and a first alignment film and a retaining wall structure; a bonding electrode is arranged on the array substrate, and located in the non-display area; the opposite substrate and the array substrate are arranged opposite to each other; the first alignment film is arranged on a side of the array substrate close to the opposite substrate; the retaining wall structure is arranged on the side of the array substrate close to the opposite substrate, and at least part of the retaining wall structure is located between the first alignment film and the bonding electrode.

19 Claims, 8 Drawing Sheets

(51) Int. Cl.
*G02F 1/1337* (2006.01)
*G02F 1/1343* (2006.01)
*H01L 27/12* (2006.01)

(52) U.S. Cl.
CPC .. *G02F 1/134345* (2021.01); *G02F 1/133345* (2013.01); *G02F 2201/07* (2013.01); *H01L 27/1218* (2013.01); *H01L 27/124* (2013.01)

(56) References Cited

FOREIGN PATENT DOCUMENTS

| | | | |
|---|---|---|---|
| CN | 106125384 | A | 11/2016 |
| CN | 105068326 | B | 9/2017 |
| CN | 110262136 | A | 9/2019 |
| CN | 210005834 | U | 1/2020 |
| CN | 111142288 | A | 5/2020 |
| CN | 112083607 | A | 12/2020 |
| CN | 111142288 | B | 6/2021 |
| WO | 2019021946 | A1 | 1/2019 |
| WO | 2021168943 | A1 | 9/2021 |

\* cited by examiner

DISPLAY PANEL AND PREPARATION METHOD THEREOF, AND DISPLAY DEVICE

CROSS-REFERENCE

The present application is based upon International Application No. PCT/CN2021/077969, filed on Feb. 25, 2021, the entire contents of which are hereby incorporated by reference.

TECHNICAL FIELD

The present disclosure relates to the field of display technologies, and in particular, to a display panel, a preparation method thereof and a display device including the same.

BACKGROUND

The market has increasingly higher requirements for display frames, which poses a higher challenge to the peripheral design of the display. For splicing screen products, the frame has been reduced to 0.4 to 0.6 mm at present.

It should be noted that the information disclosed in the Background section above is only for enhancing the understanding of the background of the present disclosure, and thus may include information that does not constitute prior art known to those of ordinary skill in the art.

SUMMARY

An objective of the present disclosure is to provide a display panel, a preparation method thereof and a display device including the same.

According to an aspect of the present disclosure, there is provided a display panel having a display area and a non-display area adjacent to the display area, wherein the display panel includes:
  an array substrate on which a bonding electrode is arranged, wherein the bonding electrode is located in the non-display area;
  an opposite substrate, arranged opposite to the array substrate;
  a first alignment film, arranged on a side of the array substrate close to the opposite substrate; and
  a retaining wall structure, arranged on the side of the array substrate close to the opposite substrate, wherein at least a part of the retaining wall structure is located between the first alignment film and the bonding electrode.

In an exemplary embodiment of the present disclosure, an orthographic projection of the retaining wall structure on the array substrate is at least partially located within an orthographic projection of the opposite substrate on the array substrate.

In an exemplary embodiment of the present disclosure, the display panel further includes:
  a sealant frame, arranged between the first alignment film and the opposite substrate, wherein the sealant frame is located in the non-display area and on a side of the bonding electrode close to the display area;
  the retaining wall structure includes:
  a first retaining wall, spaced apart from the bonding electrode; and
  a second retaining wall, arranged between the first retaining wall and the sealant frame, wherein the second retaining wall is spaced apart from the first retaining wall and the sealant frame, and at least part of the first alignment film is located on a side of the second retaining wall away from the first retaining wall.

In an exemplary embodiment of the present disclosure, the second retaining wall includes a plurality of second sub-retaining walls, and two adjacent second sub-retaining walls are spaced apart from each other.

In an exemplary embodiment of the present disclosure, the second sub-retaining wall is arranged in a strip shape, an extending direction of the second retaining wall is consistent with an extending direction of the opposing first retaining wall, and a distance between the two adjacent second sub-retaining walls is smaller than a length of the second sub-retaining wall.

In an exemplary embodiment of the present disclosure, a distance between the second retaining wall and the sealant frame is greater than or equal to 80 microns.

In an exemplary embodiment of the present disclosure, a distance between the first retaining wall and the second retaining wall is greater than or equal to 50 microns.

In an exemplary embodiment of the present disclosure, a width of the first retaining wall and a width of the second retaining wall are both greater than or equal to 15 microns and less than or equal to 25 microns, and a height of the first retaining wall and a height of the second retaining wall are both greater than or equal to 1 micron and less than or equal to 3 microns.

In an exemplary embodiment of the present disclosure, the retaining wall structure includes:
  a first retaining wall, spaced apart from the bonding electrode; and
  a barrier layer, arranged on a side of the first retaining wall away from the bonding electrode, wherein the barrier layer is spaced apart from the first retaining wall to form a groove, the barrier layer extends and covers the display area, and the first alignment film is located on a side of the barrier layer away from the array substrate.

In an exemplary embodiment of the present disclosure, a distance between the first retaining wall and the barrier layer is greater than or equal to 50 microns.

In an exemplary embodiment of the present disclosure, a width of the first retaining wall is greater than or equal to 15 microns and less than or equal to 25 microns, and a height of the first retaining wall and a height of the barrier layer are both greater than or equal to 1 micron and less than or equal to 3 microns.

In an exemplary embodiment of the present disclosure, an orthographic projection of an edge of the first retaining wall away from the display area on the array substrate overlaps with an orthographic projection of a corresponding edge of the opposite substrate on the array substrate.

In an exemplary embodiment of the present disclosure, the first retaining wall is arranged in a strip shape, and a length of the first retaining wall is greater than a length of the edge of the first alignment film opposite to the first retaining wall, or the length of the first retaining wall is greater than a length of a row formed by a plurality of bonding electrodes arranged along the extending direction of the first retaining wall.

In an exemplary embodiment of the present disclosure, the first retaining wall includes two first sub-retaining walls, the two first sub-retaining walls are arranged in the strip shape, and ends of the two first sub-retaining walls are coupled to each other and form a corner portion, and the corner portion is arranged corresponding to a corner of the array substrate.

In an exemplary embodiment of the present disclosure, the corner portion is configured as an oblique chamfer or a round chamfer.

In an exemplary embodiment of the present disclosure, the array substrate in the non-display area includes:
- a first base substrate;
- a buffer layer, arranged on a side of the first base substrate;
- a bonding lead, arranged on a side of the buffer layer away from the first base substrate; and
- an insulating layer group, arranged on a side of the bonding lead away from the first base substrate, wherein the insulating layer group is provided with a notch, so that the bonding lead is exposed to form the bonding electrode.

In an exemplary embodiment of the present disclosure, the bonding lead includes a first sub-electrode, a second sub-electrode, and a third sub-electrode; the first sub-electrode and the third sub-electrode are symmetrically arranged on both sides of the second sub-electrode, and ends of the first sub-electrode, the second sub-electrode, and the third sub-electrode are arranged in parallel, and the other ends are connected to form an integral connection portion; an orthographic projection of the first retaining wall on the first base substrate partially overlaps with an orthographic projection of the connection portion on the first base substrate.

According to another aspect of the present disclosure, there is provided a preparation method of a display panel, including:
- providing an array substrate, wherein the array substrate is provided with a bonding electrode, and the bonding electrode is located in a non-display area;
- forming a retaining wall structure on a side of the array substrate where an opposite substrate needs to be installed, wherein at least part of the retaining wall structure is located between a first alignment film and the bonding electrode;
- forming the first alignment film on the side of the array substrate where the opposite substrate needs to be installed; and
- providing the opposite substrate, wherein the opposite substrate is cell-aligned with the array substrate.

In an exemplary embodiment of the present disclosure, the forming the retaining wall structure on the side of the array substrate where the opposite substrate needs to be installed includes:
- forming a retaining wall structure material layer on the side of the array substrate where the opposite substrate needs to be installed; and
- patterning the retaining wall structure material layer to form the retaining wall structure.

According to still another aspect of the present disclosure, there is provided a display device, which includes the display panel described in any one of the above aspect.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Figure 1:
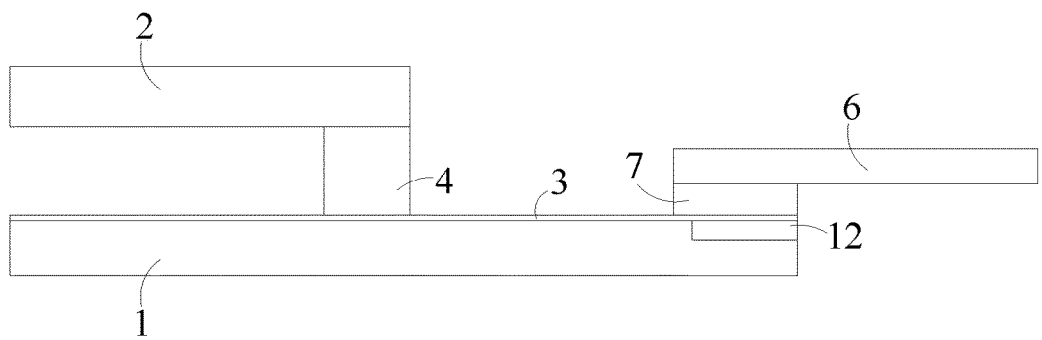
FIG. 1 is a schematic structural diagram of a front binding display panel.
Figure 2:
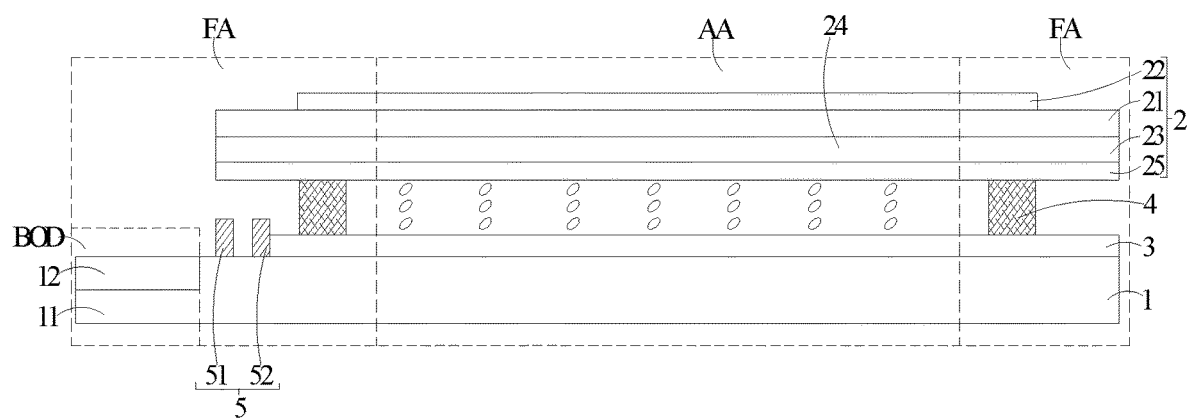
FIG. 2 is a schematic structural diagram of an exemplary embodiment of a display panel of the present disclosure.

Exemplary embodiments will now be described more fully with reference to the accompanying drawings. However, the embodiments can be implemented in a variety of forms and should not be construed as being limited to the examples set forth herein; rather, these embodiments are provided so that The present disclosure will be more complete so as to convey the idea of the exemplary embodiments to those skilled in this art. The same reference numerals in the drawings denote the same or similar parts, and the repeated description thereof will be omitted. In addition, the drawings are merely schematic representations of the present disclosure and are not necessarily drawn to scale.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; the terms "first", "second" and "third" etc. are used only as markers, and do not limit the number of objects.

In a thin film transistor-liquid crystal display (TFT-LCD), a chip on film (COF) substrate is usually used to connect a printed circuit board (PCB) and a liquid crystal panel together, so that the PCB panel can output a drive control signal to the liquid crystal panel to complete a corresponding drive control. One end of the COF substrate 6 is bound to a bonding electrode 12 of an array substrate 1, and the other end of the COF substrate 6 is coupled to the PCB panel.

In the liquid crystal display panel, the array substrate 1 is provided with an alignment film to provide a preset tilt angle for liquid crystal molecules, so that the liquid crystal molecules are arranged in an orderly manner. An inkjet printing process is a common process for preparing the alignment film, which has advantages of high efficiency and high utilization. During the preparation of the alignment film by the inkjet printing, edge of the injected ink will spread freely, resulting in poor accuracy. The inkjet ink is wavy after spreading in the edge area, and the wavy area needs to be expanded outwards as much as possible due to an uneven film thickness of the alignment film to avoid affecting a display area AA of the liquid crystal display device.

Referring to a schematic structural diagram of a front binding display panel shown in FIG. 1, the array substrate 1 and an opposite substrate 2 are arranged oppositely, and the array substrate 1 protrudes from the opposite substrate 2, that is, an orthographic projection of the opposite substrate 2 on the array substrate 1 is located within the array substrate 1. The bonding electrode 12 is arranged on an area of the array substrate 1 without the orthographic projection of the opposite substrate 2, and the bonding electrode 12 is located on a side of the array substrate 1 close to the opposite substrate 2. The COF substrate 6 is attached to the bonding electrode 12 through an anisotropic conductive adhesive 7 and electrically connected to the bonding electrode 12. A first alignment film 3 is also arranged on the side of the array substrate 1 close to the opposite substrate 2. During formation of the first alignment film 3, the flow of the first alignment film 3 cannot be precisely controlled due to restriction of the process conditions, causing the first alignment film 3 to diffuse to the bonding electrode 12. The first alignment film 3 is formed of insulating material, and may cover the bonding electrode 12, affecting the conduction of electrical signals, resulting in frequently-occurred failures such as serious line defects, and the products not being mass-producible. Therefore, how to control the flow of the first alignment film 3 has become a major bottleneck for ultra-narrow frame LCD (Liquid Crystal Display) products.

In this exemplary embodiment, the opposite substrate 2 may be a color film substrate.

Exemplary embodiments of the present disclosure provide a display panel. As schematic structural diagrams of the display panel of the present disclosure shown in FIGS. 2-8, the display panel has a display area AA and a non-display area FA adjacent to the display area AA. The display panel may include an array substrate 1, an opposite substrate 2, a sealant frame 4, a first alignment film 3, and a retaining wall structure 5. The array substrate 1 is provided with a bonding electrode 12, which is located in the non-display area FA; the opposite substrate 2 is arranged opposite to the array substrate 1; the first alignment film 3 is arranged on a side of the array substrate 1 close to the opposite substrate 2; the retaining wall structure 5 is arranged on the side of the array substrate 1 close to the opposite substrate 2, and at least part of the retaining wall structure 5 is located between the first alignment film 3 and the bonding electrode 12.

In the display panel and the preparation method thereof of the present disclosure, the retaining wall structure 5 is used to restrict the flow of the material of the first alignment film 3, which prevents the first alignment film 3 from covering the bonding electrode 12, avoids affecting the conduction of the electrical signals, thereby avoiding the frequently-occurred failures such as serious line defects, and making products being mass-producible.

In this exemplary embodiment, an orthographic projection of the retaining wall structure 5 on the array substrate 1 is at least partially located within an orthographic projection of the opposite substrate 2 on the array substrate 1, that is, the orthographic projection of the retaining wall structure 5 on the array substrate 1 can be completely located within the orthographic projection of the opposite substrate 2 on the array substrate 1, or the orthographic projection of the retaining wall structure 5 on the array substrate 1 may be partly outside the orthographic projection of the opposite substrate 2 on the array substrate 1, and partly within the orthographic projection of the opposite substrate 2 on the array substrate 1, so that the addition of the retaining wall structure 5 will not increase a width of the frame of the display panel, which still ensures the narrow frame requirement; in addition, it is ensured that there is a gap between the retaining wall structure 5 and the bonding electrode 12 in the case of process fluctuations to avoid covering the bonding electrode 12 by the retaining wall structure 5, and avoiding affecting the conduction of the electrical signals.

In this exemplary embodiment, the display panel may further include the sealant frame 4, which is arranged between the first alignment film 3 and the opposite substrate 2, located in the non-display area FA, and on a side of the bonding electrode 12 close to the display area AA.

The display panel has the display area AA and the non-display area FA adjacent to the display area AA. The non-display area FA is also provided with a bonding area (BOD), and the bonding area (BOD) is provided with the bonding electrode 12.

In this exemplary embodiment, the array substrate 1 may include a first base substrate 11 and a thin film transistor, a first electrode, and a second electrode (none of which are shown in the figure) arranged on the first base substrate 11. Specifically, a buffer layer is arranged on a side of the first base substrate 11, the first electrode is arranged on a side of the buffer layer away from the first base substrate 11, and a gate is arranged on a side of the first electrode away from the first base substrate 11. A gate insulating layer is arranged on a side of the gate away from the first base substrate 11, an active layer is arranged on a side of the gate insulating layer away from the first base substrate 11, an insulating layer is arranged on a side of the active layer away from the first base substrate 11, and the source and drain is arranged on a side of the insulating layer away from the first base substrate 11. A protective layer is arranged on a side of the source and drain away from the first base substrate 11, and a second electrode is arranged on a side of the protective layer away from the first base substrate 11. Materials of the first electrode and the second electrode may be ITO (Indium Tin Oxide). The gate, the active layer, and the source and drain form the thin film transistor. The gate is coupled to the bonding electrode 12 (gate line bonding electrode) via a gate line, and the source or drain is coupled to the bonding electrode 12 (data line bonding electrode) via a data line. The first electrode may be a pixel electrode. The second electrode may be a common electrode.

In another exemplary embodiment of the present disclosure, the array substrate 1 may include the first base substrate 11, and the thin film transistor, the first electrode, and the second electrode (none of which are shown in the figure) arranged on the first base substrate 11. Specifically, the buffer layer is arranged on the side of the first base substrate 11, the gate is arranged on the side of the buffer layer away from the first base substrate 11, the gate insulating layer is arranged on the side of the gate away from the first base substrate 11, the active layer is arranged on the side of the gate insulating layer away from the first base substrate 11, the insulating layer is arranged on the side of the active layer away from the first base substrate 11, and the source and drain is arranged on the side of the insulating layer away from the first base substrate 11. A first protective layer is arranged on the side of the source and drain away from the first base substrate 11, an organic film layer is arranged on a side of the first protective layer away from the first base substrate 11, the first electrode is arranged on a side of the organic film layer away from the first base substrate 11, a second protective layer is arranged on a side of the first electrode away from the first base substrate 11, and the second electrode is arranged on a side of the second protective layer away from the first base substrate 11. The materials of the first electrode and the second electrode may be ITO (Indium Tin Oxide). The gate, the active layer, and the source and drain form the thin film transistor. The gate is coupled to the bonding electrode 12 (gate line bonding electrode) via a gate line, and the source or drain is coupled to the bonding electrode 12 (data line bonding electrode) via a data line. The first electrode may be a pixel electrode. The second electrode may be a common electrode.

The thin film transistors in the above two exemplary embodiments are all bottom gate thin film transistors. Of course, the thin film transistors may also be top gate thin film transistors or double gate thin film transistors.

In addition, it is also possible to provide only one electrode on the array substrate 1, for example, a pixel electrode; the other electrode (for example, the common electrode) is arranged on the opposite substrate 2.

A planarization layer, a passivation layer, etc. may also be arranged on a side of the second electrode away from the first base substrate 11.

The retaining wall structure 5 is arranged on a side of the passivation layer away from the first base substrate 11. The retaining wall structure 5 can be used to separate the first alignment film 3 and the bonding electrode 12, that is, the retaining wall structure 5 is used to restrict the flow of the material of the first alignment film 3, thereby preventing the first alignment film 3 from covering the bonding electrode 12, and avoiding affecting the conduction of the electrical signals, so as to avoid the frequently-occurred failures such as serious line defects, and make products being mass-producible.

Therefore, the retaining wall structure 5 is arranged in the non-display area FA where the bonding electrode 12 is provided, and it is possible that the retaining wall structure 5 is not arranged in the non-display area FA where the bonding electrode 12 is not provided. For example, in the schematic top view of a structure of the display panel of the present disclosure shown in FIG. 3, two sides of the display panel are provided with bonding electrodes 12. Specifically, a row of bonding electrodes 12 is arranged on a long side of the display panel, which may be data line bonding electrodes; and a row of bonding electrodes 12 is also arranged on a wide side of the display panel, which can be gate line bonding electrodes. An area where the bonding electrodes 12 are located is the bonding area (BOD), and the bonding area (BOD) can be configured as a rectangle, and a length direction of the rectangle is consistent with the long side or the wide side of the display panel. Retaining wall structures 5 are arranged on the two sides where the bonding electrodes 12 are provided, and no retaining wall structure 5 is arranged on the other two sides where the bonding electrodes 12 are not provided.

Referring to FIGS. 2 to 6, in this exemplary embodiment, the retaining wall structure 5 may include a first retaining wall 51 and a second retaining wall 52. The first retaining wall 51 and the bonding electrode 12 are spaced apart. An orthographic projection of an edge of the first retaining wall 51 away from the display area AA on the array substrate 1 overlaps with an orthographic projection of a corresponding edge of the opposite substrate 2 on the array substrate 1. That is, the edge of the first retaining wall 51 away from the display area AA is flush with the edge of the opposite substrate 2 opposite to the first retaining wall 51, so that the addition of the retaining wall structure 5 does not increase the width of the frame of the display panel, which still ensures the narrow frame requirement; in addition, it is ensured that there is a gap between the retaining wall structure 5 and the bonding electrode 12 in the case of process fluctuations to avoid covering the bonding electrode 12 by the retaining wall structure 5, and avoiding affecting the conduction of the electrical signals.

In the case where the retaining wall structure 5 is arranged on only one side, the first retaining wall 51 can be provided in a strip shape, which specifically may be a straight strip shape or a curved strip shape, both of which belong to the protection scope of the present disclosure.

Figure 3:
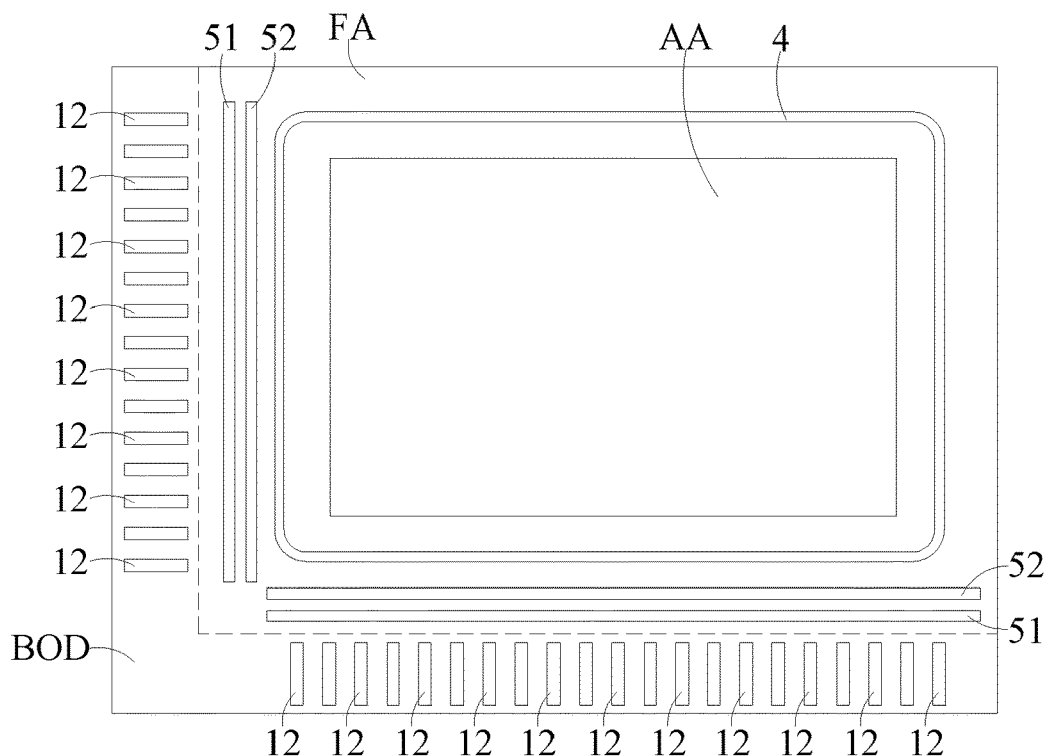
FIG. 3 is a schematic top view of a structure of FIG. 2.

Referring to FIG. 3, in the case where the retaining wall structures 5 are arranged on two sides of the display panel, and the retaining wall structures 5 are arranged on the adjacent two sides; the two first retaining walls 51 can both be provided as strip shapes, which specifically may be straight strip shapes or curved strip shapes.

Figure 4:
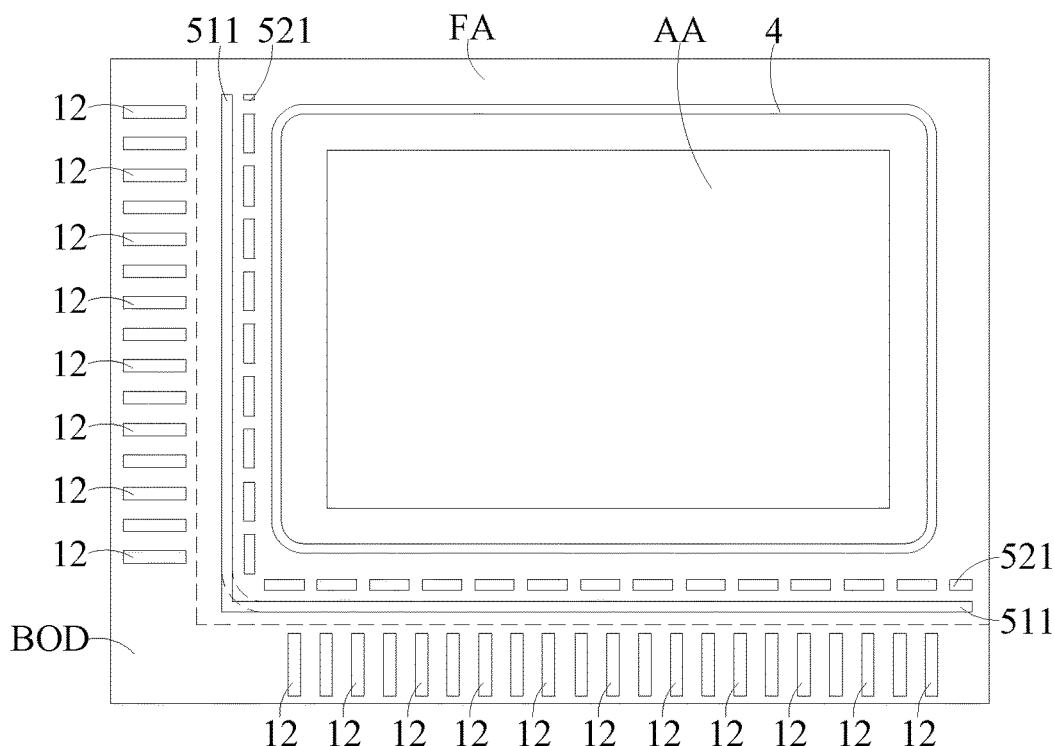
FIG. 4 is a schematic structural diagram of an exemplary embodiment of a display panel of the present disclosure.

Referring to FIG. 4, it may also be that the first retaining wall 51 includes two first sub-retaining walls 511, one of the first sub-retaining walls 511 is arranged on the long side of the display panel, and the other is arranged on the short side of the display panel. The two first sub-retaining walls 511 are both provided as strip shapes, which specifically may be straight strip shapes or curved strip shapes. Ends of the two first sub-retaining walls 511 are coupled to each other and form a corner portion. The corner portion can be set in an arc shape, that is, a round chamfer (as shown by the dashed line in the figure), can also be directly coupled to form an included angle, or can be set as an oblique chamfer; the corner portion is set corresponding to a corner of the array substrate 1. That is, the corner portion is located at the corner of the array substrate 1 in order to match the corner of the array substrate 1.

Of course, when the retaining wall structures 5 are arranged on three or four sides of the display panel, the three or four first retaining walls 51 may all be arranged in strip shapes and not coupled to each other. Alternatively, the first retaining wall 51 includes three first sub-retaining walls 511, and the three first sub-retaining walls 511 are sequentially coupled to form a semi-enclosed shape; or the first retaining wall 51 includes four first sub-retaining walls 511, and the four first sub-retaining walls 511 are sequentially coupled to form a rectangular box.

A width of the first retaining wall 51 is greater than or equal to 15 microns and less than or equal to 25 microns, and a height of the first retaining wall 51 is greater than or equal to 1 micron and less than or equal to 3 microns. A height of the first retaining wall 51 is smaller than a height of the sealant frame 4 to avoid excessive support in the display panel assembly.

In the case where the first retaining walls 51 are arranged in strip shapes without being coupled to each other, a length of the first retaining wall 51 is greater than a length of the edge of the first alignment film 3 opposite to the first retaining wall 51, that is, the length of the first retaining wall 51 at a long side of the first alignment film 3 may be greater than the length of the long side of the first alignment film 3, and the length of the first retaining wall 51 at a short side of the first alignment film 3 may be greater than the length of the short side of the first alignment film 3, so as to ensure the first retaining wall 51 can completely block the flow of the first alignment film 3 to the bonding electrode 12.

The length of the first retaining wall 51 may be greater than a length of a row formed by plurality of bonding electrodes 12 arranged along an extending direction of the first retaining wall 51. For example, The plurality of bonding electrodes 12 arranged on the long side of the first alignment film 3 form the row, and a distance from a side of a first bonding electrode 12 away from the remaining bonding electrodes 12 to a side of the last bonding electrode 12 away from the remaining bonding electrodes 12 is the length of the row. Of course, the plurality of bonding electrodes 12 may also have a certain misalignment; in this way, the first retaining wall 51 can completely protect the bonding electrodes 12 and prevent the flow of the first alignment film 3 to the bonding electrode 12.

The second retaining wall 52 is arranged between the first retaining wall 51 and the sealant frame 4. The second retaining wall 52 and the first retaining wall 51 are spaced apart, and a distance between the first retaining wall 51 and the second retaining wall 52 is greater than or equal to 50 microns. Such an arrangement can ensure that the first retaining wall 51 and the second retaining wall 52 are spaced apart, so that in the case of process fluctuations, it can avoid the overlap of the first retaining wall 51 and the second retaining wall 52 to form only one retaining wall. The second retaining wall 52 is spaced apart from the sealant frame 4. A distance between the second retaining wall 52 and the sealant frame 4 is greater than or equal to 80 microns. Such an arrangement can ensure that in the case of process fluctuations, sufficient error space is provided for the formation of the sealant frame 4, avoiding the overlap of the sealant frame 4 and the second retaining wall 52, making the formation foundation of the sealant frame 4 relatively flat and also making the formed sealant frame 4 relatively flat, so as to better bond the array substrate 1 and the opposite substrate 2 to ensure the sealing between the array substrate 1 and the opposite substrate 2.

Figure 5:
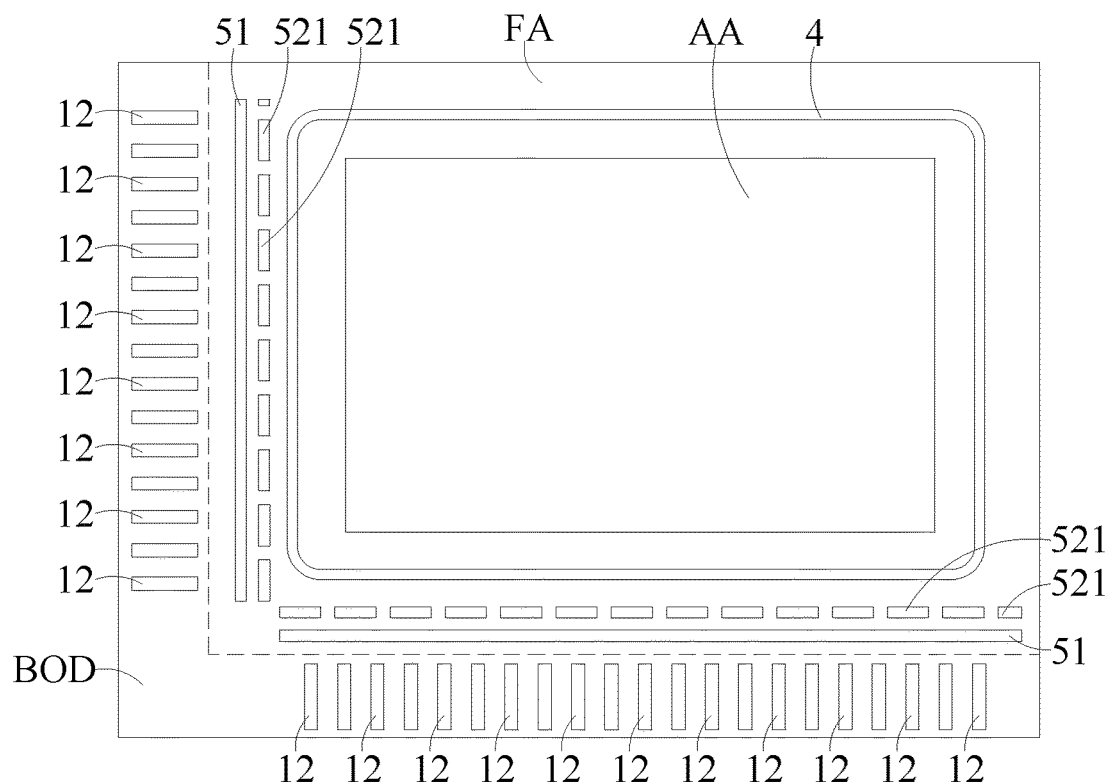
FIG. 5 is a schematic structural diagram of an exemplary embodiment of a display panel of the present disclosure.

Referring to FIGS. 4 and 5, the second retaining wall 52 may include a plurality of second sub-retaining walls 521, and two adjacent second sub-retaining walls 521 are spaced apart. A gap between two adjacent second sub-retaining walls 521 can allow part of the excessive material of the first alignment film 3 to flow through, thereby preventing the material of the first alignment film 3 from flowing back to the display area AA to affect the display effect. In addition, the material of the first alignment film 3 flowing through the second sub-blocking wall 521 is blocked by the first blocking wall 51 to prevent the material of the first alignment film 3 from flowing to the bonding electrode 12. In this case, the subsequently formed first alignment film 3 is located on the side of the first retaining wall 51 close to the display area AA.

The second sub-retaining wall 521 can be arranged in the strip shape, which specifically may be the straight strip shape or the curved strip shape. An extending direction of the second sub-retaining wall 521 is consistent with the extending direction of the opposing first retaining wall 51, that is, the second sub-retaining wall 521 and the opposing first retaining wall 51 are substantially parallel to each other. A distance between two adjacent second sub-retaining walls 521 is less than or equal to the length of the second sub-retaining wall 521, and the distance between two adjacent second sub-retaining walls 521 may be an integer multiple of the pixel. The length of the second sub-retaining wall 521 may also be an integer multiple of the pixel. Such an arrangement can ensure that the second retaining wall 52 is sufficient to block the first alignment film 3.

The plurality of second sub-retaining walls 521 may be arranged along one straight line to form a row, or may not be arranged along one straight line, but arranged in a staggered manner along multiple straight lines, as long as it is ensured that the distance between the second retaining wall 52 and the first retaining wall 51 is enough.

Of course, in other exemplary embodiments of the present disclosure, referring to FIG. 3, the second retaining wall 52 may also be arranged in the same strip shape as the first retaining wall 51. In this case, the material of the first alignment film 3 may flow out from the unconnected corner of the second retaining wall 52.

The second retaining wall 52 can also be arranged in an integral "L" shape or a semi-enclosing shape. In this case, the material of the first alignment film 3 may flow along the second retaining wall 52 to a side without the retaining wall structure 5. The second retaining wall 52 may also be configured as an integral rectangular frame. In this case, the subsequently formed first alignment film 3 is located on the side of the second retaining wall 52 close to the display area AA.

Figure 6:
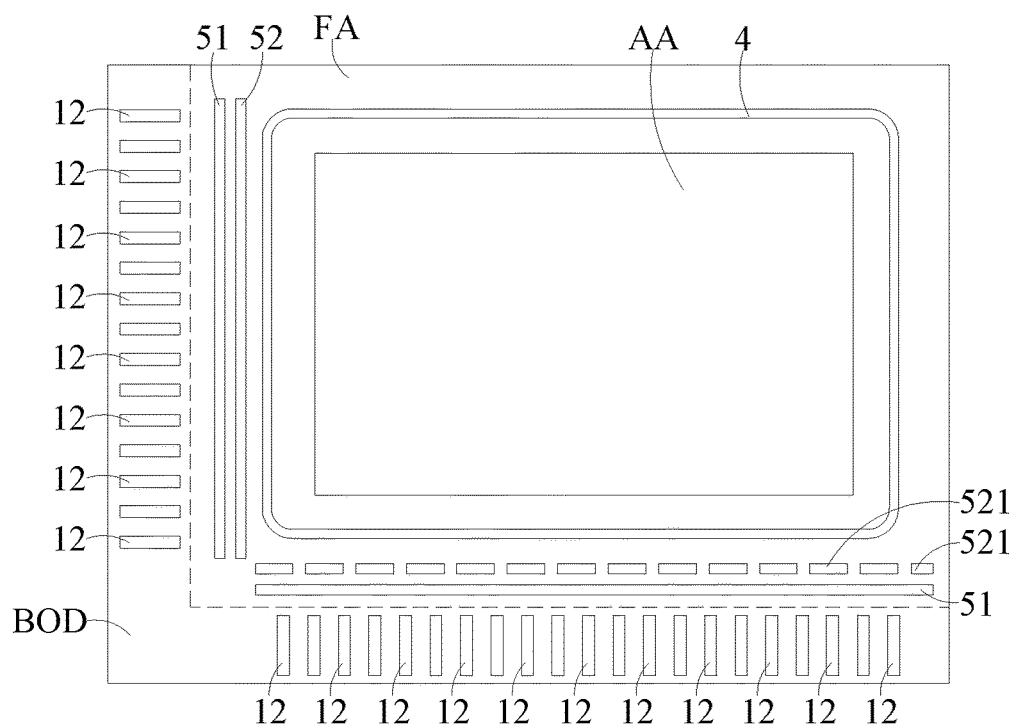
FIG. 6 is a schematic structural diagram of an exemplary embodiment of a display panel of the present disclosure.

In addition, referring to FIG. 6, in the case where multiple second retaining walls 52 are provided, one second retaining wall 52 can also be configured as a structure including multiple second sub-retaining walls 521, in order to provide an outlet for the flow of the material of the first alignment film 3, and the other second retaining wall 52 is configured as an integral strip shape, or an "L" shape, or a semi-enclosed shape.

A width of the second retaining wall 52 is greater than or equal to 15 microns and less than or equal to 25 microns, and a height of the second retaining wall 52 is greater than or equal to 1 micron and less than or equal to 3 microns. The height of the second retaining wall 52 is smaller than a height of the sealant frame 4 to avoid excessive support in the display panel assembly. Since the second retaining wall 52 and the first retaining wall 51 are formed by the same patterning process, the width of the second retaining wall 52 and the width of the first retaining wall 51 may be different, but the height of the second retaining wall 52 is substantially the same as that of the first retaining wall 51.

Materials of the first retaining wall 51 and the second retaining wall 52 can be organic materials, R/G/B color film layer materials, OC (OVER COATING) planarization layer materials, PS (Photo Spacer, UV hardening PAA resin) materials and so on.

Figure 7:
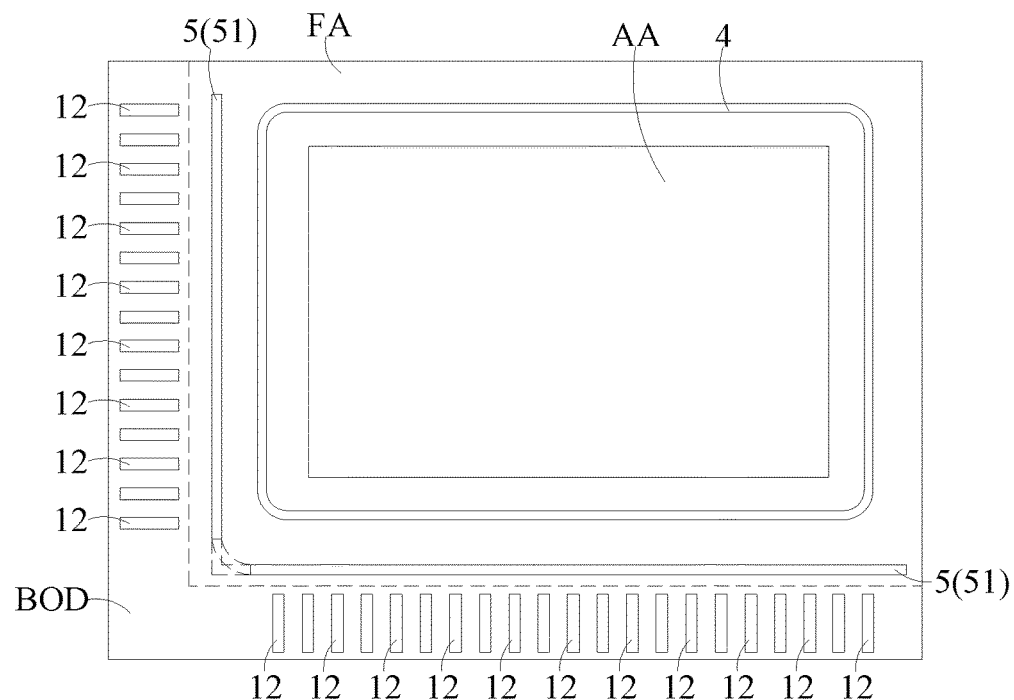
FIG. 7 is a schematic structural diagram of an exemplary embodiment of a display panel of the present disclosure.

In addition, in some other exemplary embodiments of the present disclosure, as shown in FIG. 7, the retaining wall structure 5 may include only first retaining walls 51, and the first retaining walls 51 may be arranged in strip shapes without being coupled to each other. Alternatively, the first retaining walls 51 are coupled to form the corner portion (as shown by the dashed lines in the figure), and the specific structure of the first retaining wall 51 is the same as that of the first retaining wall 51 in the above exemplary embodiments, so it will not be repeated here. Of course, the retaining wall structure 5 may also include three or more retaining walls and so on.

Figure 8:
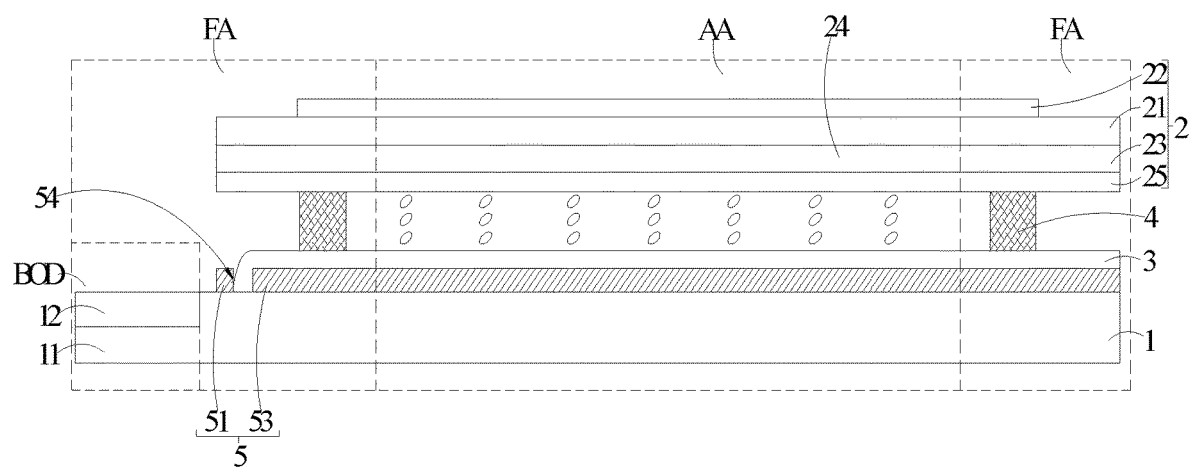
FIG. 8 is a schematic structural diagram of an exemplary embodiment of a display panel of the present disclosure.

In other exemplary embodiments of the present disclosure, referring to FIG. 8, the retaining wall structure 5 may include the first retaining wall 51 and a barrier layer 53. The first retaining wall 51 and the bonding electrode 12 are spaced apart; and the barrier layer 53 is arranged on a side of the first retaining wall 51 away from the bonding electrode 12, the barrier layer 53 is spaced apart from the first retaining wall 51 to form a groove 54. The barrier layer 53 extends and covers the display area AA, and the first alignment film 3 is located on a side of the barrier layer 53 away from the array substrate 1.

The specific structure of the first retaining wall 51 is the same as that of the first retaining wall 51 in the above exemplary embodiments, and therefore, it will not be repeated here.

It should be noted that in the case where the bonding electrodes 12 are provided on two or more sides, it is sufficient to change the structure or the number of first retaining walls 51, and there is no need to provide the barrier layer 53. For example, in the case where the bonding electrodes 12 are provided on adjacent two sides, two strip-shaped first retaining walls 51 can be arranged on these two sides, and the two first retaining walls 51 and the barrier layer 53 are both formed with grooves 54. Alternatively, the first retaining wall 51 includes two first sub-retaining walls 511, the two first sub-retaining walls 511 and the barrier layer 53 are both formed with grooves 54, and the two first sub-retaining walls 511 are both configured as strip shapes. Ends of the two first sub-retaining walls 511 are coupled to each other and form the corner portion. The corner portion can be arc-shaped or directly coupled to form an included angle; the corner portion is arranged corresponding to the corner of the array substrate 1. That is, the corner portion is located at the corner of the array substrate 1 in order to match the corner of the array substrate 1.

Due to such arrangement, in a subsequent process of forming the first alignment film 3, the excess first alignment film 3 will flow into the groove 54, thereby restricting the flow of the material of the first alignment film 3 and avoiding the first alignment film 3 from covering and the bonding electrode 12 to avoid affecting the conduction of the electrical signals, so as to avoid the frequently-occurred failures such as serious line defects, and make products being mass-producible.

A distance between the first retaining wall 51 and the barrier layer 53 is greater than or equal to 50 microns. This arrangement can ensure that in the case of process fluctuations, the first barrier wall 51 and the barrier layer 53 are spaced apart to form the groove 54, avoiding the overlapping of the first retaining wall 51 and the barrier layer 53 without forming the groove 54.

The width of the first retaining wall 51 is greater than or equal to 15 microns and less than or equal to 25 microns, and the height of the first retaining wall 51 and a height of the barrier layer 53 are greater than or equal to 1 micron and less than or equal to 3 microns to ensure that a groove 54 of sufficient depth is formed, in order to accommodate the excess material of the first alignment film 3.

The material of the first retaining wall 51 may be an organic material or an inorganic material.

A material of the barrier layer 53 may be the organic material or the inorganic material, as long as it is a transparent material, because the barrier layer 53 covers the display area AA and needs to allow the light to pass through.

Of course, since the first retaining wall 51 and the barrier layer 53 are formed by the same patterning process, the material of the first retaining wall 51 and the barrier layer 53 are the same. The height of the first retaining wall 51 and the height of the barrier layer 53 are substantially the same.

Figure 9:
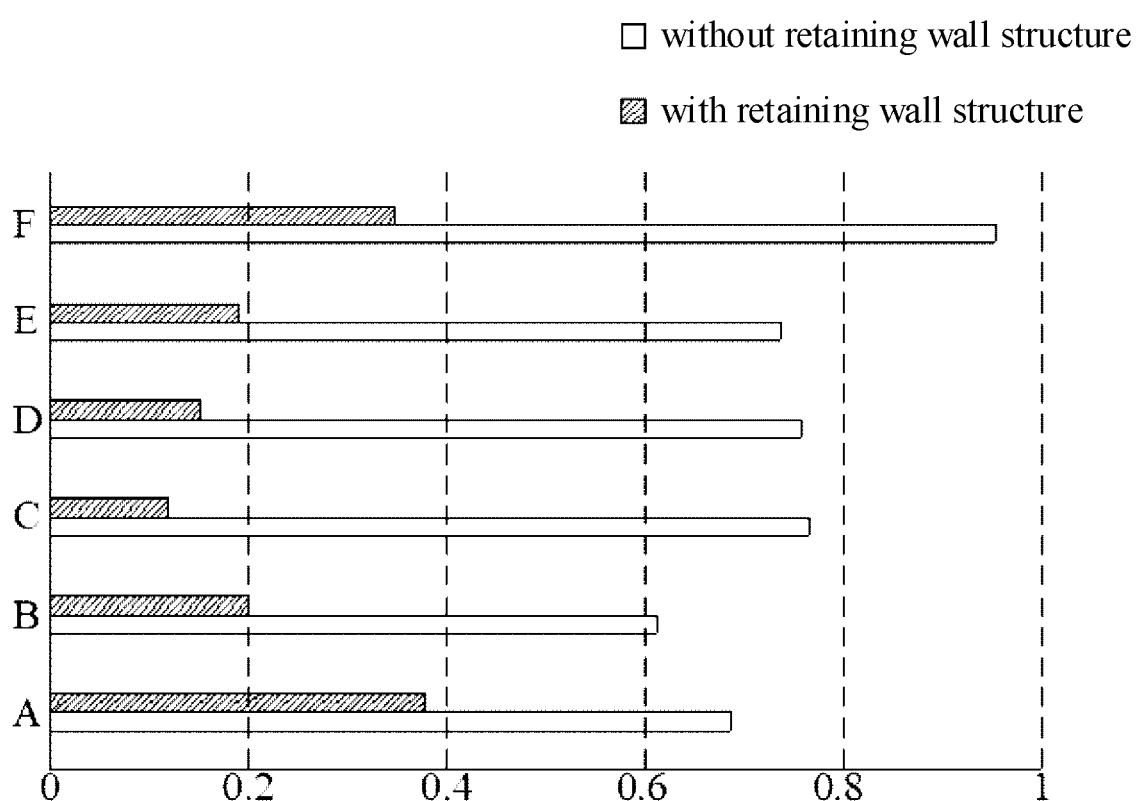
FIG. 9 is a comparison diagram of actually measured data of edge margins of a first alignment film of a display panel with a retaining wall structure and a first alignment film of a display panel without a retaining wall structure.

Referring to a comparison diagram of actually measured data of edge margins of a first alignment film 3 with a retaining wall structure 5 and a first alignment film 3 without a retaining wall structure 5 in different display panel test samples shown in FIG. 9, the abscissa in the figure represents actually measured data of the edge margin of the first alignment film 3, in micron. As can be seen from the figure: the edge margin of the first alignment film 3 when the F test sample is provided with the retaining wall structure 5 is about 0.35 microns, and the edge margin of the first alignment film 3 when the retaining wall structure 5 is not provided is about 0.95 microns; the edge margin of the first alignment film 3 when the test sample E is provided with the retaining wall structure 5 is about 0.19 microns, and the edge margin of the first alignment film 3 when the retaining wall structure 5 is not provided is about 0.73 microns; the edge margin of the first alignment film 3 when the D test sample is provided with the retaining wall structure 5 is about 0.16 microns, and the edge margin of the first alignment film 3 when the retaining wall structure 5 is not provided is about 0.75 microns; the edge margin of the first alignment film 3 when the C test sample is provided with the retaining wall structure 5 is about 0.11 microns, and the edge margin of the first alignment film 3 when the retaining wall structure 5 is not provided is about 0.76 microns; the edge margin of the first alignment film 3 when the B test sample is provided with the retaining wall structure 5 is about 0.2 microns, and the edge margin of the first alignment film 3 when the retaining wall structure 5 is not provided is about 0.62 microns; the edge margin of the first alignment film 3 when the A test sample is provided with the retaining wall structure 5 is about 0.38 microns, and the edge margin of the first alignment film 3 when the retaining wall structure 5 is not provided is about 0.69 microns.

Figure 10:
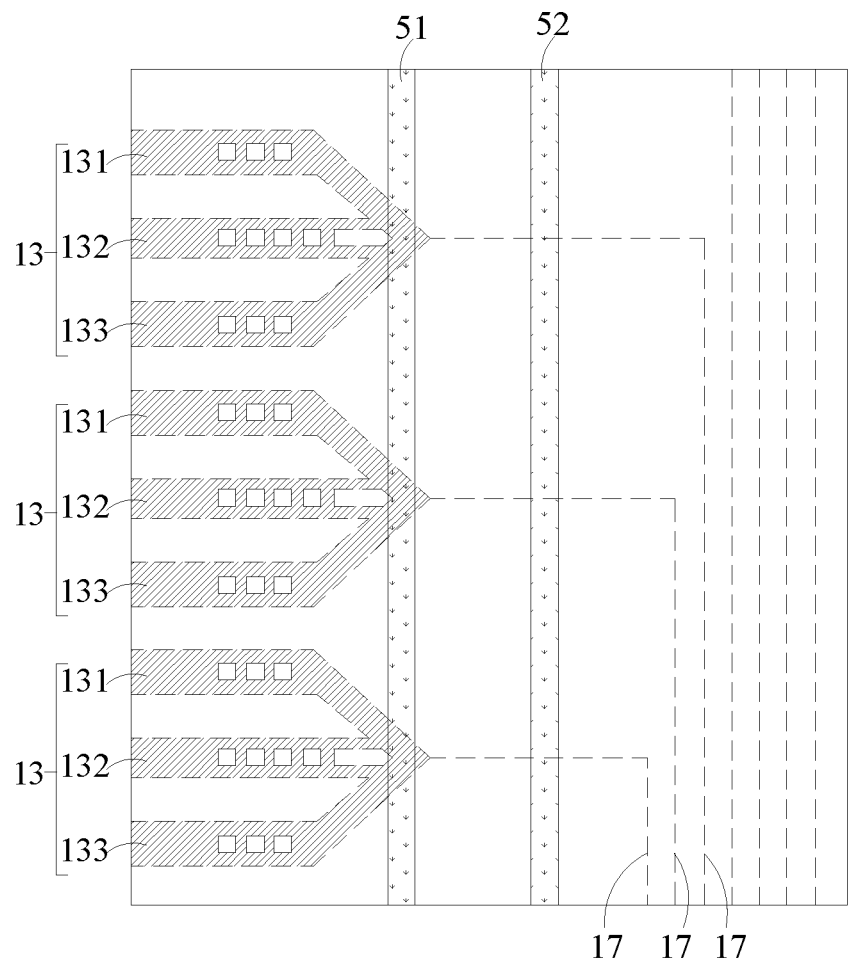
FIG. 10 is a schematic structural diagram of a positional relationship between a bonding lead of a gate line and a retaining wall structure in a display panel of the present disclosure.
Figure 11:
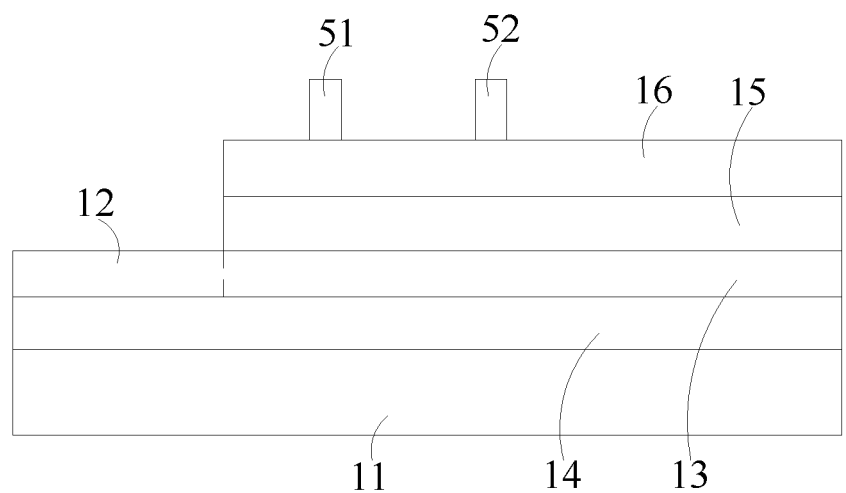
FIG. 11 is a schematic cross-sectional view of a structure of FIG. 10.

Referring to schematic structural diagrams of a positional relationship between a bonding lead of a gate line and a retaining wall structure shown in FIG. 10 and FIG. 11, a plurality of gate lines 17 are arranged in parallel, and one gate line 17 is coupled to one bonding lead 13. The bonding lead 13 may include a first sub-electrode 131, a second sub-electrode 132, and a third sub-electrode 133; the first sub-electrode 131 and the third sub-electrode 133 are symmetrically arranged on both sides of the second sub-electrode 132, and ends of the first sub-electrode 131, the second sub-electrode 132, and the third sub-electrode 133 are arranged in parallel, and the other end is coupled as a whole. Specifically, the second sub-electrode 132 is arranged in a long strip shape. The first sub-electrode 131 includes two segments coupled to each other, and the two segments are coupled to form an obtuse angle, one of which is parallel to the second sub-electrode 132, and one end of the other segment is coupled to the end of the second sub-electrode 132. The third sub-electrode 133 includes two segments coupled to each other, and the two segments are connected to form an obtuse angle, one of which is parallel to the second sub-electrode 132, and one end of the other segment is coupled to the end of the second sub-electrode 132 and the end of the first sub-electrode 131 to form the connection portion. The connection portion is approximately triangular. The gate line 17 is coupled to the top end of the connection portion after being bent. The gate line 17 is relatively thin, and this arrangement can increase an area of the bonding lead 13 to facilitate subsequent bonding. Of course, the bonding lead of the data line can also be set in this way.

Referring to FIG. 11, a buffer layer 14 is arranged on a side of the first base substrate 11, and a gate (not shown in the figure), a gate line 17 and a bonding lead 13 are arranged on a side of the buffer layer 14 away from the first base substrate 11. A gate insulating layer 15 is arranged on a side of the gate, the gate line 17 and the bonding lead 13 of the gate line 17 away from the first base substrate 11, and a protective layer 16 is arranged on a side of the gate insulating layer 15 away from the first base substrate 11. The gate insulating layer 15 and the protective layer 16 form an insulating layer group. Of course, the insulating layer group may also include a passivation layer, an interlayer dielectric layer, etc., or only include the insulating layer. The protective layer 16 and the gate insulating layer 15 are removed at a position where the bonding is required to expose the bonding lead 13 to form the bonding electrode 12.

An orthographic projection of the first retaining wall 51 on the first base substrate 11 partially overlaps with an orthographic projection of the connection portion of the bonding lead 13 on the first base substrate 11, but the first retaining wall 51 and the bonding electrode 12 are spaced apart.

The opposite substrate 2 may include a second base substrate 21, a polarizer 22 arranged on a side of the second base substrate 21, a black matrix 23 and a color film layer 24 arranged on the opposite side of the second base substrate 21, and a second alignment film 25 arranged on a side of the black matrix 23 and the color film layer 24 away from the second base substrate 21. The second alignment film 25 is located on the side close to the array substrate 1.

Figure 12:
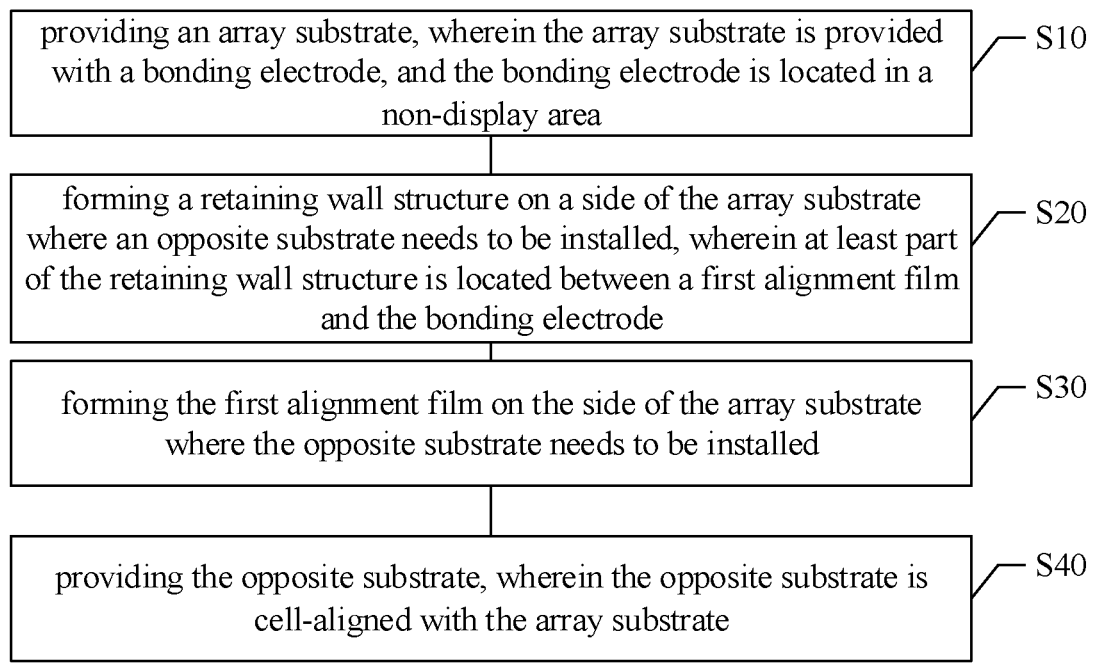
FIG. 12 is a schematic block diagram of a process of an exemplary embodiment of a preparation method of a display panel of the present disclosure.

Further, the disclosed exemplary embodiments also provide a preparation method of a display panel. Refer to a schematic block diagram of a process of an exemplary embodiment of the preparation method of the display panel shown in FIG. 12. The preparation method of the display panel may include the following steps:

In step S10, an array substrate 1 is provided. The array substrate 1 is provided with a bonding electrode 12, and the bonding electrode 12 is located in a non-display area FA.

In step S20, a retaining wall structure 5 is formed on a side of the array substrate 1 where an opposite substrate needs to be installed. At least part of the retaining wall structure 5 is located between a first alignment film 3 and the bonding electrode 12.

In step S30, the first alignment film 3 is formed on the side of the array substrate 1 where the opposite substrate needs to be installed.

In step S40, the opposite substrate is provided, and the opposite substrate is cell-aligned with the array substrate 1.

The opposite substrate 2 may be a color film substrate.

Figure 13:
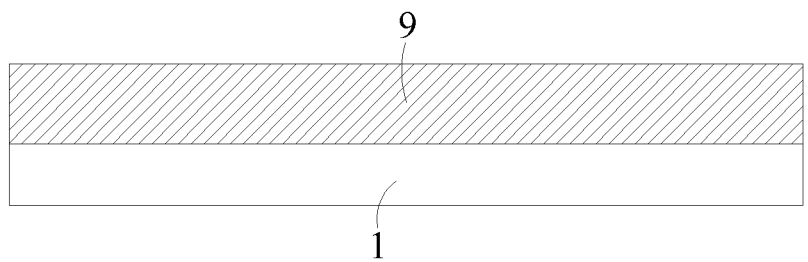
FIGS. 13-15 are schematic structural diagrams of various steps of preparing a retaining wall structure.
Figure 14:
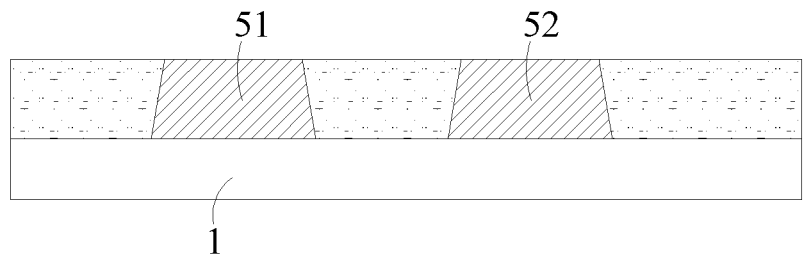
Figure 15:
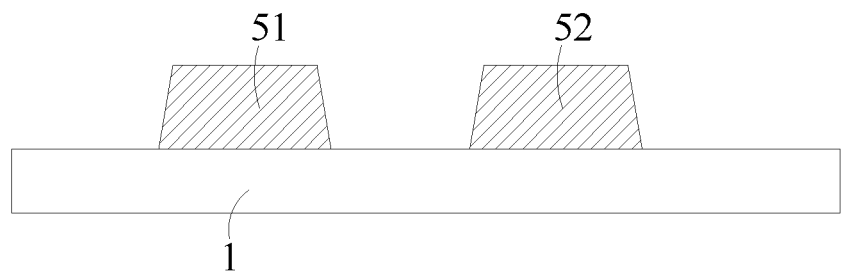

In this exemplary embodiment, referring to FIG. 13, a retaining wall structure material layer 9 is formed on the side of the array substrate 1 where the opposite substrate 2 needs to be installed, and a material of the retaining wall structure material layer 9 is a photosensitive material, for example, a photoresist; referring to FIG. 14, a mask is arranged on a side of the retaining wall structure material layer 9 away from the array substrate 1 to expose the retaining wall structure material layer 9; referring to FIG. 15, the retaining wall structure material layer 9 which has been irradiated by ultraviolet light is removed to form the retaining wall structure 5.

Of course, it is possible that the material of the retaining wall structure material layer 9 is not the photosensitive material. In this case, the photoresist needs to be formed on the retaining wall structure material layer 9, and the mask is arranged on a side of the photoresist away from the array substrate 1. The photoresist is exposed to remove the photoresist irradiated by ultraviolet light, so that part of the retaining wall structure material layer 9 is exposed, and then the retaining wall structure material layer 9 is etched to form the retaining wall structure 5.

A specific structure of the retaining wall structure 5 has been described in detail above, so it will not be repeated here.

It should be noted that although modules or units of devices for executing functions are described above, such division of modules or units is not mandatory. In fact, features and functions of two or more of the modules or units described above may be embodied in one module or unit in accordance with the embodiments of the present disclosure. Alternatively, the features and functions of one module or unit described above may be further divided into multiple modules or units.

In addition, although the various steps of the preparation method of the display panel in the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on.

Further, the disclosed exemplary embodiments also provide a display device, which may include the display panel described in any one of the above embodiments. A specific structure of the display panel has been described in detail above, and therefore, it will not be repeated here.

A specific type of the display device is not particularly limited. Types of display devices commonly used in the field can be used, such as mobile devices such as mobile phones, wearable devices such as watches, VR devices, etc., those skilled in the art can make a corresponding selection according to the specific purpose of the display device, and it will not be repeated here.

It should be noted that, in addition to the display panel, the display device also includes other necessary components. Taking a display as an example, a housing, a circuit board, a power supply line and the like may be included. Those skilled in the art can make corresponding supplements according to the specific usage requirements of the display device, which will not be repeated here.

Compared with the prior art, the beneficial effects of the display device provided by the exemplary embodiments of the present disclosure are the same as the beneficial effects of the display panel provided by the above-mentioned exemplary embodiments, and will not be repeated here.

Other embodiments of the present disclosure will be apparent to those skilled in the art after those skilled in the art consider the specification and practice the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel having a display area and a non-display area adjacent to the display area, wherein the display panel comprises:
    an array substrate on which a bonding electrode is arranged, wherein the bonding electrode is located in the non-display area;
    an opposite substrate, arranged opposite to the array substrate;
    a first alignment film, arranged on a side of the array substrate close to the opposite substrate; and
    a retaining wall structure, arranged on the side of the array substrate close to the opposite substrate, wherein at least a part of the retaining wall structure is located between the first alignment film and the bonding electrode,
    wherein the array substrate in the non-display area comprises:
    a first base substrate;
    a buffer layer, arranged on a side of the first base substrate;
    a bonding lead, arranged on a side of the buffer layer away from the first base substrate; and
    an insulating layer group, arranged on a side of the bonding lead away from the first base substrate, wherein the insulating layer group is provided with a notch, so that the bonding lead is exposed to form the bonding electrode.

2. The display panel according to claim 1, wherein an orthographic projection of the retaining wall structure on the array substrate is at least partially located within an orthographic projection of the opposite substrate on the array substrate.

3. The display panel according to claim 2, wherein the display panel further comprises:
    sealant frame, arranged between the first alignment film and the opposite substrate, wherein the sealant frame is located in the non-display area and on a side of the bonding electrode close to the display area;
    the retaining wall structure comprises:
    a first retaining wall, spaced apart from the bonding electrode; and
    a second retaining wall, arranged between the first retaining wall and the sealant frame, wherein the second retaining wall is spaced apart from the first retaining wall and the sealant frame, and at least part of the first alignment film is located on a side of the second retaining wall away from the first retaining wall.

4. The display panel according to claim 3, wherein the second retaining wall comprises a plurality of second sub-retaining walls, and two adjacent second sub-retaining walls are spaced apart from each other.

5. The display panel according to claim 4, wherein the second sub-retaining wall is arranged in strip shape, an extending direction of the second retaining wall is consistent with an extending direction of the opposing first retaining wall, and a distance between the two adjacent second sub-retaining walls is smaller than a length of the second sub-retaining wall.

6. The display panel according to claim 3, wherein a distance between the second retaining wall and the sealant frame is greater than or equal to 80 microns.

7. The display panel according to claim 3, wherein a distance between the first retaining wall and the second retaining wall is greater than or equal to 50 microns.

8. The display panel according to claim 3, wherein a width of the first retaining wall and a width of the second retaining wall are both greater than or equal to 15 microns and less than or equal to 25 microns, and a height of the first retaining wall and a height of the second retaining wall are both greater than or equal to 1 micron and less than or equal to 3 microns.

9. The display panel according to claim 3, wherein an orthographic projection of an edge of the first retaining wall away from the display area on the array substrate overlaps with an orthographic projection of a corresponding edge of the opposite substrate on the array substrate.

10. The display panel according to claim 3, wherein the first retaining wall is arranged in strip shape, and a length of the first retaining wall is greater than a length of an edge of the first alignment film opposite to the first retaining wall, or the length of the first retaining wall is greater than a length of a row formed by a plurality of bonding electrodes arranged along an extending direction of the first retaining wall.

11. The display panel according to claim 3, wherein the first retaining wall comprises two first sub-retaining walls, the two first sub-retaining walls are arranged in strip shape, and ends of the two first sub-retaining walls are coupled to each other and form a corner portion, and the corner portion is arranged corresponding to a corner of the array substrate.

12. The display panel according to claim 11, wherein the corner portion is configured as an oblique chamfer or a round chamfer.

13. The display panel according to claim 1, wherein the retaining wall structure comprises:
    a first retaining wall, spaced apart from the bonding electrode; and
    a barrier layer, arranged on a side of the first retaining wall away from the bonding electrode, wherein the barrier layer is spaced apart from the first retaining wall to form a groove, the barrier layer extends and covers the display area, and the first alignment film is located on a side of the barrier layer away from the array substrate.

14. The display panel according to claim 13, wherein a distance between the first retaining wall and the barrier layer is greater than or equal to 50 microns.

15. The display panel according to claim 13, wherein a width of the first retaining wall is greater than or equal to 15 microns and less than or equal to 25 microns, and a height of the first retaining wall and a height of the barrier layer are both greater than or equal to 1 micron and less than or equal to 3 microns.

16. The display panel according to claim 1, wherein the bonding lead comprises a first sub-electrode, a second sub-electrode, and a third sub-electrode; the first sub-electrode and the third sub-electrode are symmetrically arranged on both sides of the second sub-electrode, and ends of the first sub-electrode, the second sub-electrode, and the third sub-electrode are arranged in parallel, and the other ends are connected to form an integral connection portion; an orthographic projection of the first retaining wall on the first base substrate partially overlaps with an orthographic projection of the connection portion on the first base substrate.

17. A display device comprising the display panel according to claim 1.

18. A preparation method of a display panel, comprising:
    providing an array substrate, wherein the array substrate is provided with a bonding electrode, and the bonding electrode is located in a non-display area;
    forming a retaining wall structure on a side of the array substrate where an opposite substrate needs to be installed, wherein at least part of the retaining wall structure is located between a first alignment film and the bonding electrode;

forming the first alignment film on the side of the array substrate where the opposite substrate needs to be installed; and providing the opposite substrate, wherein the opposite substrate is cell-aligned with the array substrate, wherein the array substrate in the non-display area comprises:

a first base substrate;

a buffer layer, arranged on a side of the first base substrate;

a bonding lead, arranged on a side of the buffer layer away from the first base substrate; and an insulating layer group, arranged on a side of the bonding lead away from the first base substrate, wherein the insulating layer group is provided with a notch, so that the bonding lead is exposed to form the bonding electrode.

19. The preparation method of the display panel according to claim 18, wherein the forming the retaining wall structure on the side of the array substrate where the opposite substrate needs to be installed comprises:

forming a retaining wall structure material layer on the side of the array substrate where the opposite substrate needs to be installed; and patterning the retaining wall structure material layer to form the retaining wall structure.

* * * * *